United States Patent
You

(10) Patent No.: US 7,701,799 B2
(45) Date of Patent: Apr. 20, 2010

(54) SEMICONDUCTOR DEVICE

(75) Inventor: Min Young You, Cheongju-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 919 days.

(21) Appl. No.: 11/458,208

(22) Filed: Jul. 18, 2006

(65) Prior Publication Data

US 2007/0083696 A1    Apr. 12, 2007

(30) Foreign Application Priority Data

Oct. 12, 2005   (KR) ...................... 10-2005-0096255

(51) Int. Cl.
*G11C 8/00*   (2006.01)
(52) U.S. Cl. ............................ 365/230.02; 365/230.01; 365/230.06; 365/230.08; 365/233.11; 365/239
(58) Field of Classification Search ............ 365/230.02, 365/230.06, 230.08, 233.11, 230.01, 239
See application file for complete search history.

(56) References Cited

U.S. PATENT DOCUMENTS

| | | | |
|---|---|---|---|
| 5,920,883 A | 7/1999 | Tamaki et al. | |
| 5,940,875 A * | 8/1999 | Inagaki et al. | 711/217 |
| 6,141,271 A * | 10/2000 | Yoon et al. | 365/201 |
| 6,223,264 B1 | 4/2001 | Vogley | |
| 6,487,567 B1 * | 11/2002 | Michelman et al. | 715/210 |
| 6,557,090 B2 * | 4/2003 | Ho | 711/163 |
| 6,650,583 B2 * | 11/2003 | Haraguchi et al. | 365/201 |
| 6,829,178 B2 * | 12/2004 | Koyama et al. | 365/189.07 |
| 7,505,353 B2 * | 3/2009 | Kim et al. | 365/230.05 |
| 7,512,018 B2 * | 3/2009 | Kim | 365/189.02 |

FOREIGN PATENT DOCUMENTS

| | | |
|---|---|---|
| JP | 11-162170 | 6/1999 |
| KR | 2004-56787 | 7/2004 |

* cited by examiner

*Primary Examiner*—Viet Q Nguyen
(74) *Attorney, Agent, or Firm*—Marshall, Gerstein & Borun LLP

(57) ABSTRACT

A semiconductor device may include a decoder for decoding a plurality of internal command signals and outputting a first Y-address enabling signal; a Y-address enabling signal generator for receiving the first Y-address enabling signal and outputting a second Y-address enabling signal having a predetermined enabled period; a multiplexer (MUX) for receiving the first Y-address enabling signal and the second Y-address enabling signal and selectively outputting any one thereof as a Y-address enabling signal; and a MUX controller for controlling the MUX such that the MUX selects any one of the first Y-address enabling signal or second Y-address enabling signal according to an operation mode of the semiconductor device.

34 Claims, 5 Drawing Sheets

SEMICONDUCTOR DEVICE

TECHNICAL FIELD

This patent relates to a semiconductor device, and more particularly to a semiconductor device for generating a Y-address enabling signal, which determines the width of a Y-address select signal, using a system clock in a write mode, so as to smoothly process data even in a high-speed write operation, with little influence of variations in external conditions, such as temperature, voltage, etc., or variations in process.

DESCRIPTION OF THE RELATED ART

Generally, in a semiconductor device, particularly a dynamic random access memory (DRAM) device, a Y-address select signal (column address select signal) is used to select a Y-address (column address) in a read or write operation. In particular, the Y-address select signal is an important factor in determining a data window when data is written in a memory cell. A Y-address enabling signal (column address enabling signal) is an enabling signal which is used in generating the Y-address select signal. The width of the Y-address select signal is determined depending on the width of the Y-address enabling signal.

However, in a conventional semiconductor device, an internal delay circuit including a resistor-capacitor (R-C) circuit is used in generating the Y-address enabling signal, resulting in a variation in the width of the Y-address enabling signal due to an external condition variation (voltage variation or temperature variation), process variation or the like, thus causing a variation in the width of the Y-address select signal. In particular, because the variation in the width of the Y-address select signal reduces a data window in the write operation, it acts as an obstruction to normal data processing. This problem is more prominent in a high-speed operation of the semiconductor device where the Y-address select signal is reduced in width. This problem with the conventional semiconductor device will hereinafter be described in detail with reference to FIG. 1.

FIG. 1 shows the configuration of the conventional semiconductor device.

As shown in FIG. 1, a clock buffer 10 buffers external clocks CLK and CLKB to output an internal clock ICLK. A command buffer 120 buffers an external clock enabling signal CKE, external chip select signal CSB, external row address strobe (RAS) signal RASB, external column address strobe (CAS) signal CASB and external write enabling signal WEB to output a plurality of commands CST, RAST, CAST and WET. A command decoder 130 receives the commands CST, RAST, CAST and WET from the command buffer 120 and the internal clock ICLK from the clock buffer 110 and outputs an internal write command signal IWTP, internal read command signal IRDP, internal burst enabling signal IBEP and internal write enabling signal WTS synchronously with the internal clock ICLK. Here, the internal write enabling signal WTS is enabled upon input of an external write command so that a write operation can be performed. The internal write command signal IWTP is an internal command which is generated synchronously with the internal clock ICLK under the condition that the internal write enabling signal WTS is enabled, to command execution of the write operation. The internal read command signal IRDP is an internal command which is generated synchronously with the internal clock ICLK under the condition that the internal write enabling signal WTS is disabled, to command execution of a read operation. The internal burst enabling signal IBEP is an internal command which is enabled upon input of an external read or write command to command execution of a burst operation.

A decoder 140 decodes the internal write command signal IWTP, internal read command signal IRDP and internal burst enabling signal IBEP inputted thereto to output an enabling signal YAE_1 for generation of a Y-address select signal in response to enabled states of the inputted internal commands. A Y-address enabling signal generator 150 receives the enabling signal YAE_1 and generates a Y-address enabling signal YAE_2. Finally, a driver 160 drives the Y-address enabling signal YAE_2 to a desired level to output a final Y-address enabling signal YAE.

However, in the above-mentioned conventional semiconductor device, in the process of generating the Y-address enabling signal YAE_2, the Y-address enabling signal generator 150 adjusts the width of the Y-address enabling signal YAE_2 through the use of an internal delay circuit including a resistor-capacitor (R-C) circuit. In this connection, in the case where an external condition variation (voltage variation or temperature variation), process variation or the like occurs in the semiconductor device, a delay operation of the internal delay circuit is subject to a variation, causing a variation in the width of the Y-address enabling signal YAE_2. As a result, a variation occurs in the Y-address select signal. In particular, because the variation in the width of the Y-address select signal reduces a data window in the write operation, it acts as an obstruction to normal data processing. This problem is more prominent in a high-speed operation of the semiconductor device where the Y-address select signal is reduced in width.

SUMMARY OF THE INVENTION

A semiconductor device for generating a Y-address enabling signal, which determines the width of a Y-address select signal, may use a system clock in a write mode, so as to smoothly process data even in a high-speed write operation, with little influence of variations in external conditions, such as temperature, voltage, etc., or variations in process.

A semiconductor device may include a decoder for decoding a plurality of internal command signals and outputting a first Y-address enabling signal; a Y-address enabling signal generator for receiving the first Y-address enabling signal and outputting a second Y-address enabling signal having a predetermined enabled period; a multiplexer (MUX) for receiving the first Y-address enabling signal and the second Y-address enabling signal and selectively outputting any one thereof as a Y-address enabling signal; and a MUX controller for controlling the MUX such that the MUX selects any one of the first Y-address enabling signal or second Y-address enabling signal according to an operation mode of the semiconductor device.

A semiconductor device may include a clock buffer for buffering a external clock to generate an internal clock; a clock period adjuster for adjusting a period of the internal clock; a command buffer for buffering a plurality of external command signals; a command decoder operated synchronously with an internal clock from the clock period adjuster, the command decoder decoding a plurality of command signals from the command buffer and generating a plurality of internal command signals; a decoder for decoding the internal command signals from the command decoder and outputting a first Y-address enabling signal; a Y-address enabling signal generator for receiving the first Y-address enabling signal and outputting a second Y-address enabling signal having a predetermined enabled period; a multiplexer (MUX) for receiving the first Y-address enabling signal and the second Y-address enabling signal and selectively outputting any one thereof as a Y-address enabling signal; and a MUX controller for controlling the MUX such that the MUX selects any one of the first Y-address enabling signal or second Y-address enabling signal according to an operation mode of the semiconductor device.

The MUX controller may select and output a signal having a longer enabled period, of the first Y-address enabling signal and second Y-address enabling signal, when the semiconductor device is in a write mode.

When the semiconductor device is in a test mode, the MUX controller may select and output the second Y-address enabling signal irrespective of whether the semiconductor device is in the write mode.

The first Y-address enabling signal may have an enabled period longer than that of the second Y-address enabling signal.

The MUX controller may include a first logic unit for performing a logic operation with respect to an internal write enabling signal and a test mode signal to output a MUX control signal.

The first logic unit may perform an AND operation.

The MUX may include a second logic unit for performing a logic operation with respect to the first Y-address enabling signal and the second Y-address enabling signal; a first transfer gate for transferring an output signal from the second logic unit in response to the MUX control signal; and a second transfer gate for transferring the second Y-address enabling signal in response to the MUX control signal.

The second logic unit may perform an OR operation.

The Y-address enabling signal generator may include a delay for delaying the first Y-address enabling signal by a predetermined period; a buffer for buffering an output signal from the delay; and a logic unit for performing a logic operation with respect to the first Y-address enabling signal and an output signal from the buffer to output the second Y-address enabling signal.

The buffer may an inverter, the inverter performing an inverting/buffering operation.

The logic unit may perform an AND operation.

The decoder may perform an OR operation with respect to the internal command signal to output the first Y-address enabling signal.

The semiconductor device may further include a driver for driving the Y-address enabling signal from the MUX to a desired level.

A semiconductor device may include a decoder for decoding a plurality of internal command signals and outputting a first Y-address enabling signal; a Y-address enabling signal generator for receiving the first Y-address enabling signal and outputting a second Y-address enabling signal having a predetermined enabled period; and a multiplexer (MUX) for receiving the first Y-address enabling signal and the second Y-address enabling signal, selecting any one thereof based on an operation mode of the semiconductor device in response to a MUX control signal, and outputting the selected signal as a Y-address enabling signal.

The MUX may select and output a signal having a longer enabled period, of the first Y-address enabling signal and second Y-address enabling signal, when the semiconductor device is in a write mode.

The first Y-address enabling signal may have an enabled period longer than that of the second Y-address enabling signal.

The MUX control signal may be an internal write enabling signal.

The MUX may include a logic unit for performing a logic operation with respect to the first Y-address enabling signal and the second Y-address enabling signal; a first transfer gate for transferring an output signal from the logic unit in response to the MUX control signal; and a second transfer gate for transferring the second Y-address enabling signal in response to the MUX control signal.

The logic unit may perform an OR operation.

The Y-address enabling signal generator may include a delay for delaying the first Y-address enabling signal by a predetermined period; an inverter for inverting/buffering an output signal from the delay; and a logic unit for performing a logic operation with respect to the first Y-address enabling signal and an output signal from the inverter to output the second Y-address enabling signal.

The logic unit may perform an AND operation.

The decoder may perform an OR operation with respect to the internal command signals to output the first Y-address enabling signal.

BRIEF DESCRIPTION OF THE DRAWINGS

The above features and other advantages will be more clearly understood from the following detailed description taken in conjunction with the accompanying drawings, in which.

DETAILED DESCRIPTION

Figure 1:
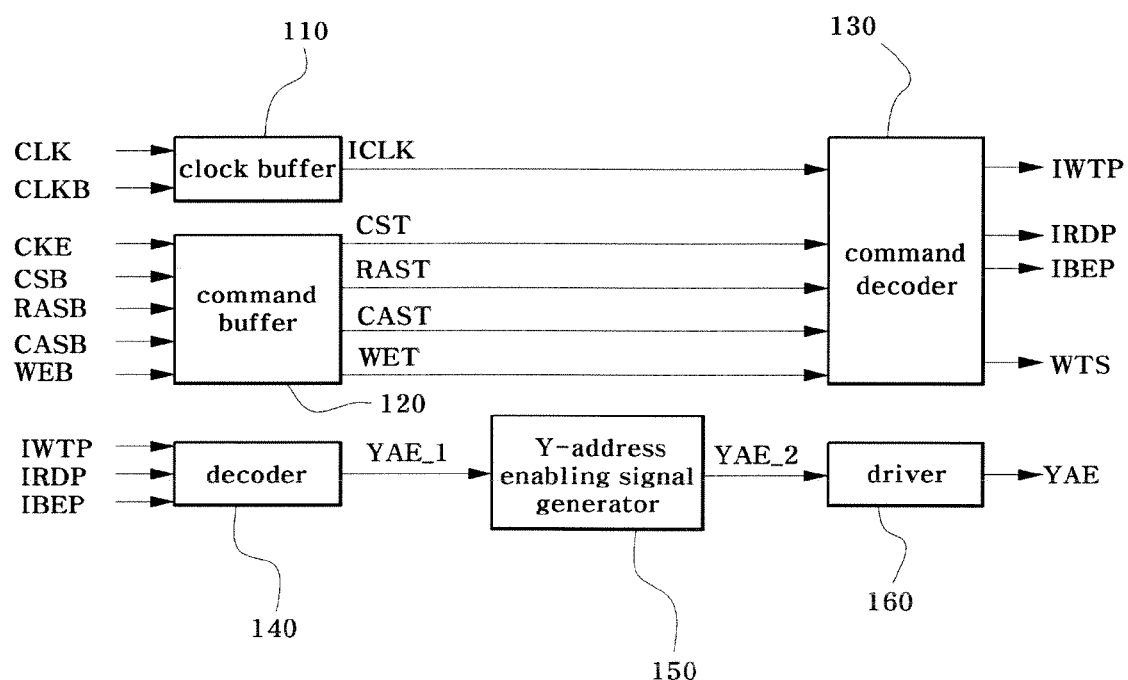
FIG. 1 is a block diagram showing the configuration of a conventional semiconductor device.

Reference will now be made in detail to embodiments, examples of which are illustrated in the accompanying drawings, wherein like reference numerals refer to like elements throughout.

Figure 2:
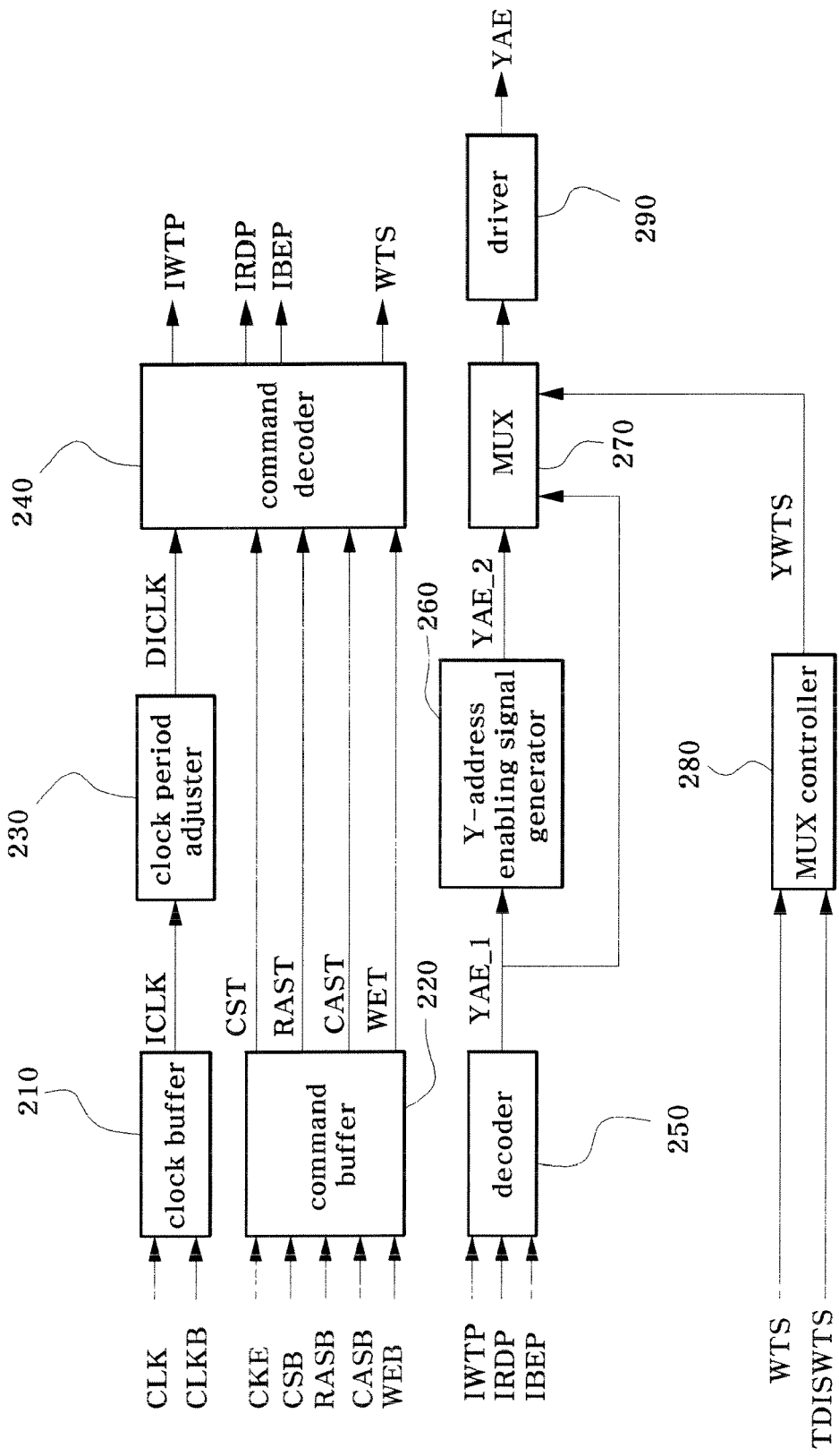
FIG. 2 is a block diagram showing the configuration of a semiconductor device according to an exemplary embodiment.
Figure 3:
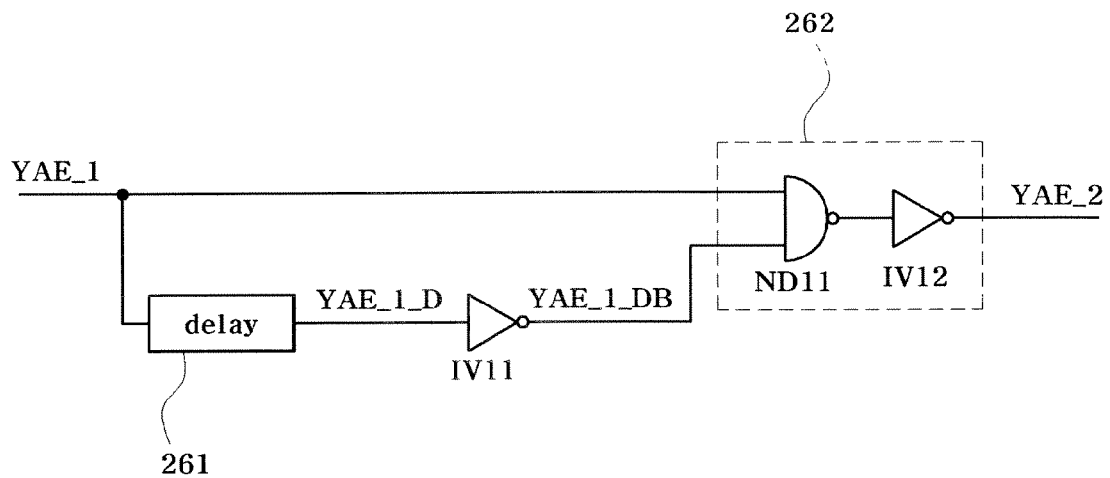
FIG. 3 is a circuit diagram of a Y-address enabling signal generator in the semiconductor device according to this embodiment.
Figure 4:
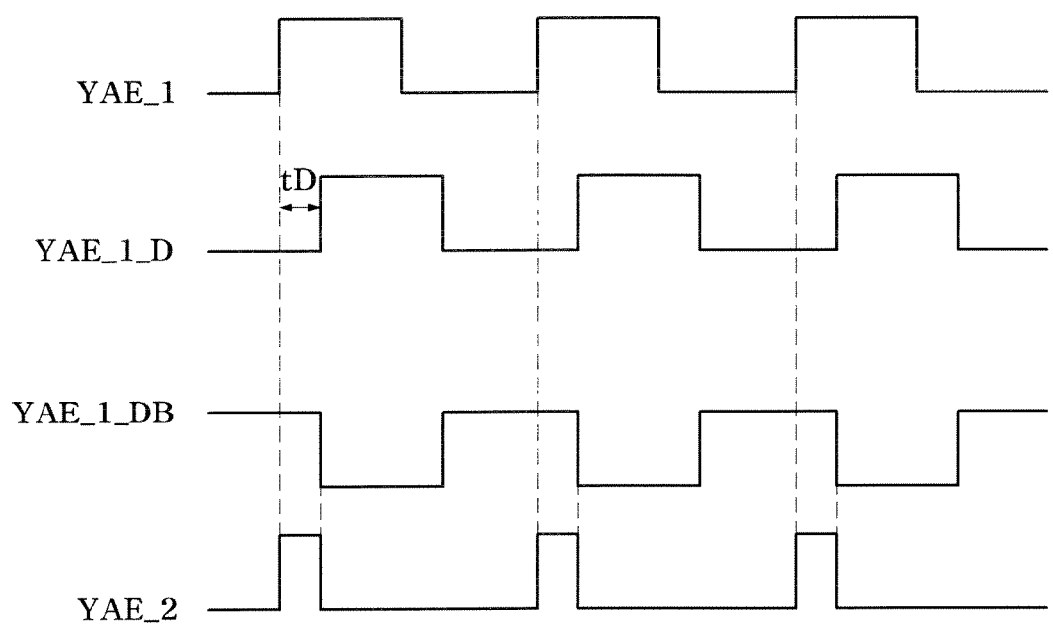
FIG. 4 is a timing diagram illustrating the operation of the Y-address enabling signal generator in the semiconductor device according to this embodiment.
Figure 5:
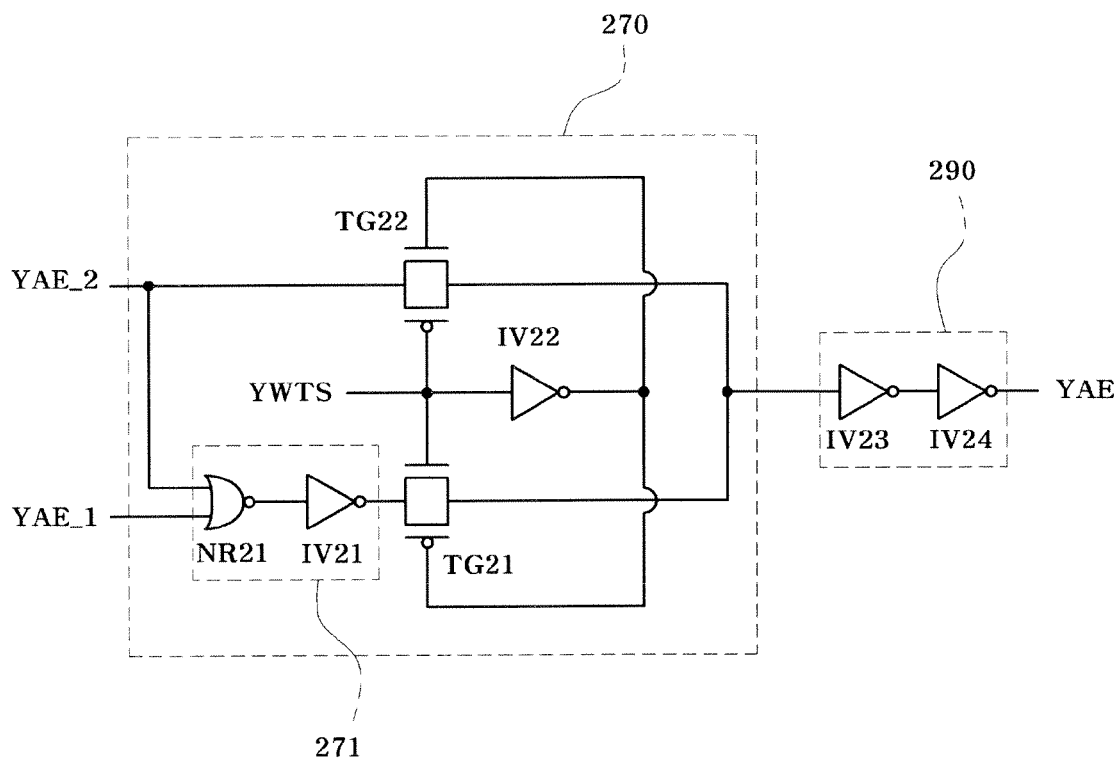
FIG. 5 is a circuit diagram of a multiplexer and driver in the semiconductor device according to this embodiment.
Figure 6:
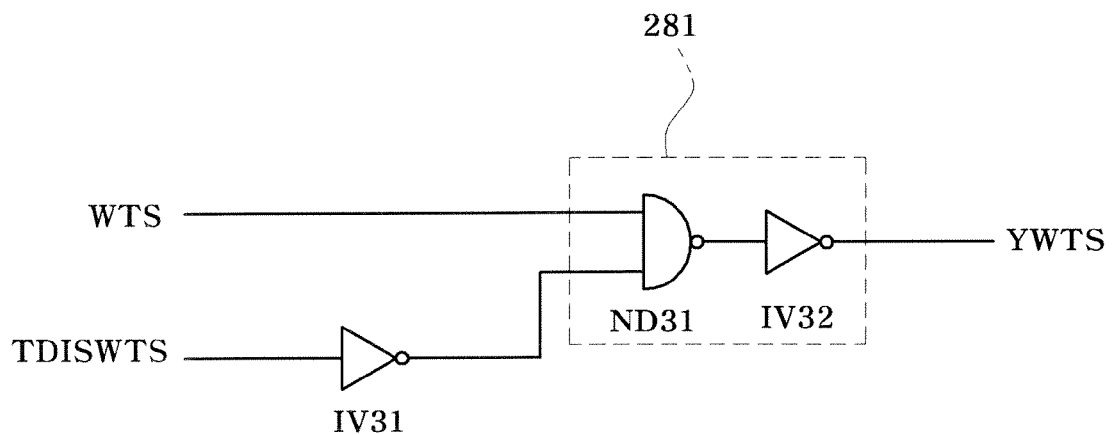
FIG. 6 is a circuit diagram of a multiplexer controller in the semiconductor device according to this embodiment.
Figure 7:
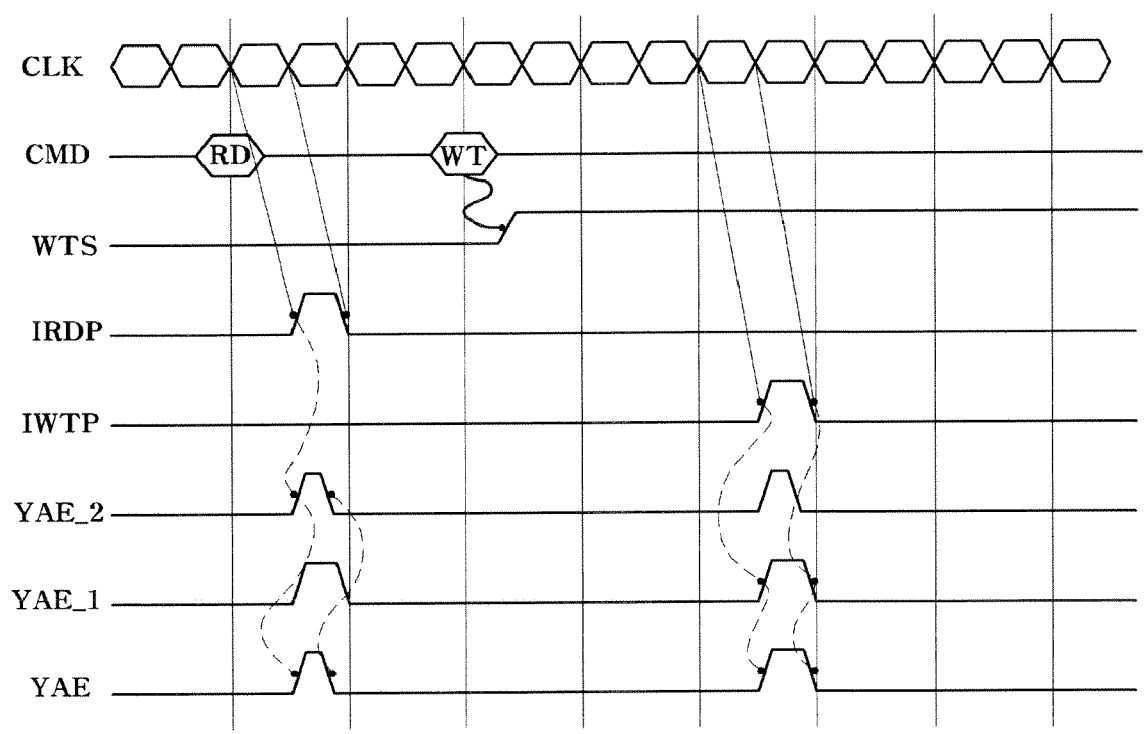
FIG. 7 is a timing diagram illustrating the operation of the semiconductor device according to this embodiment.

FIG. 2 shows the configuration of a semiconductor device according to an exemplary embodiment of the present invention, FIG. 3 shows the configuration of a Y-address enabling signal generator in the semiconductor device according to this embodiment, FIG. 4 is a timing diagram illustrating the operation of the Y-address enabling signal generator in the semiconductor device according to this embodiment, FIG. 5 shows the configuration of a multiplexer and driver in the semiconductor device according to this embodiment, FIG. 6 shows the configuration of a multiplexer controller in the semiconductor device according to this embodiment, and FIG. 7 is a timing diagram illustrating the operation of the semiconductor device according to this embodiment. The semiconductor device according to the present embodiment will hereinafter be described with reference to FIGS. 2 to 7.

With reference to FIG. 2, the semiconductor device according to the present embodiment may include a clock buffer 210 for buffering external clocks CLK and CLKB to generate an internal clock ICLK, a clock period adjuster 230 for adjusting the period of the internal clock ICLK, a command buffer 220 for buffering a plurality of external command signals CKE, CSB, RASB, CASB and WEB, and a command decoder 240 which is operated synchronously with an internal clock DICLK from the clock period adjuster 230. The command decoder 240 is adapted to decode a plurality of command signals CST, RAST, CAST and WET from the command buffer 220 to generate a plurality of internal command signals IWTP, IRDP and IBEP. The semiconductor device according to the present embodiment further may include a decoder 250 for decoding the internal command signals IWTP, IRDP and IBEP to output a first Y-address enabling signal YAE_1, a Y-address enabling signal generator 260 for receiving the first Y-address enabling signal YAE_1 and outputting a second Y-address enabling signal YAE_2 having a predetermined enabled period, a multiplexer (MUX) 270 for receiving the first Y-address enabling signal YAE_1 and the second Y-address enabling signal YAE_2 and selectively outputting any one thereof as a Y-address enabling signal YAE, and a MUX controller 280 for controlling the MUX 270 according to the operation mode of the semiconductor device such that the MUX 270 selects any one of the first Y-address enabling signal YAE_1 or second Y-address enabling signal YAE_2.

With reference to FIG. 3, the Y-address enabling signal generator 260 includes a delay 261 for delaying the first Y-address enabling signal YAE_1 by a predetermined period, an inverter IV11 for inverting/buffering an output signal from the delay 261, and a logic unit 262 for performing an AND operation with respect to the first Y-address enabling signal YAE_1 and an output signal from the inverter IV11 to output the second Y-address enabling signal YAE_2.

With reference to FIG. 5, the MUX 270 includes a logic unit 271 for performing an OR operation with respect to the first Y-address enabling signal YAE_1 and the second Y-address enabling signal YAE_2, a transfer gate TG21 for transferring an output signal from the logic unit 271 in response to a MUX control signal YWTS, and a transfer gate TG22 for transferring the second Y-address enabling signal YAE_2 in response to the MUX control signal YWTS. With reference to FIG. 6, the MUX controller 280 includes a logic unit 281 for performing the AND operation with respect to an inverted signal of a test mode signal TDISWTS and an internal write enabling signal WTS to output the MUX control signal YWTS.

The operation of the semiconductor device with the above-stated configuration according to the present embodiment will hereinafter be described in detail with reference to FIGS. 2 to 7.

As shown in FIG. 2, the clock buffer 210 buffers the external clocks CLK and CLKB to output the internal clock ICLK. The clock period adjuster 230 receives the internal clock ICLK, changes the period thereof, as needed, and outputs the resulting internal clock DICLK. Here, the period of the internal clock DICLK may be set to be the same as that of the internal clock ICLK. Alternatively, in order to increase enabled periods of the Y-address enabling signal YAE and Y-address select signal, the period of the internal clock DICLK may be set to be, for example, two or four times as long as that of the internal clock ICLK. A preferable embodiment of the clock period adjuster 230 is a clock divider.

The command buffer 220 buffers an external clock enabling signal CKE, external chip select signal CSB, external RAS signal RASB, external CAS signal CASB and external write enabling signal WEB to output a plurality of commands CST, RAST, CAST and WET. The command decoder 240 receives the commands CST, RAST, CAST and WET from the command buffer 220 and the internal clock DICLK from the clock period adjuster 230 and outputs an internal write command signal IWTP, internal read command signal IRDP, internal burst enabling signal IBEP and internal write enabling signal WTS synchronously with the internal clock DICLK. Here, the internal write enabling signal WTS is enabled upon input of an external write command so that a write operation can be performed. The internal write command signal IWTP is an internal command which is generated synchronously with the internal clock DICLK under the condition that the internal write enabling signal WTS is enabled, to command execution of the write operation. The internal read command signal IRDP is an internal command which is generated synchronously with the internal clock DICLK under the condition that the internal write enabling signal WTS is disabled, to command execution of a read operation. The internal burst enabling signal IBEP is an internal command which is enabled upon input of an external read or write command to command execution of a burst operation.

The decoder 250 decodes the internal write command signal IWTP, internal read command signal IRDP and internal burst enabling signal IBEP inputted thereto to output the first Y-address enabling signal YAE_1. Here, the first Y-address enabling signal YAE_1 is enabled in a period corresponding to enabled periods of the internal commands inputted to the decoder 250. The decoder 250 may be implemented with a general NOR gate-based circuit to perform an OR operation, or any other type of circuit. As shown in FIG. 7, each of the internal write command signal IWTP and internal read command signal IRDP is generated synchronously with the internal clock DICLK so as to have an enabled period corresponding to the width of the internal clock DICLK (FIG. 7 illustrates the case where the period of the internal clock DICLK is the same as that of the external clock CLK). For this reason, the enabled period of the first Y-address enabling signal YAE_1 is determined depending on the width of the internal clock DICLK.

Next, the Y-address enabling signal generator 260 receives the first Y-address enabling signal YAE_1 and generates the second Y-address enabling signal YAE_2 whose enabled period is shorter than that of the first Y-address enabling signal YAE_1. The operation of the Y-address enabling signal generator 260 will hereinafter be described in more detail with reference to FIGS. 3 and 4. First, the delay 261 delays the first Y-address enabling signal YAE_1 by a predetermined period tD and outputs the resulting signal YAE_1_D. The inverter IV11 inverts/buffers the output signal YAE_1_D from the delay 261 and outputs the resulting signal YAE_1_DB. Then, the logic unit 262, which is composed of a NAND gate ND11 and an inverter IV12, performs the AND operation with respect to the first Y-address enabling signal YAE_1 and the output signal YAE_1_DB from the inverter IV11 to output the second Y-address enabling signal YAE_2. As a result, the second Y-address enabling signal YAE_2 is enabled high in level for the period tD, as shown in FIG. 4.

Thereafter, the MUX 270 receives the first Y-address enabling signal YAE_1 and the second Y-address enabling signal YAE_2 and selectively outputs any one thereof in response to the MUX control signal YWTS, which is outputted from the MUX controller 280. The MUX controller 280 receives the internal write enabling signal WTS and test mode signal TDISWTS and outputs the MUX control signal YWTS, which is determined in level according to the operation mode of the semiconductor device. The operations of the MUX controller 280 and MUX 270 based on the operation mode of the semiconductor device will hereinafter be described in more detail with reference to FIGS. 5 and 6.

First, in the case where the semiconductor device is in a general operation mode, for example, a read mode, not in a test mode, the internal write enabling signal WTS is disabled low in level, as shown in FIG. 7. in this case, the test mode signal TDISWTS is disabled low in level, because the operation mode of the semiconductor device is not the test mode. As a result., in FIG. 6, an output signal from an inverter IV31 becomes high in level, and the logic unit 281 performs the AND operation with respect to the low-level internal write enabling signal WTS and the high-level output signal from the inverter IV31 and thus outputs the MUX control signal YWTS which is low in level.

Then, in the MUX 270 of FIG. 5, the transfer gate TG21 is turned off and the transfer gate TG22 is turned on, thereby causing the second Y-address enabling signal YAE_2 to be transferred through the transfer gate TG22. As a result, the second Y-address enabling signal YAE_2 is outputted from the MUX 270. Then, a driver 290 drives the second Y-address enabling signal YAE_2 to a desired voltage level to output the final Y-address enabling signal YAE.

Therefore, in the case where the semiconductor device is in the read mode, the final Y-address enabling signal YAE has the same enabled period as that of the second Y-address enabling signal YAE_2, as shown in FIG. 7.

On the other hand, when the external write command is inputted in a general operation mode, not in the test mode, the internal write enabling signal WTS is enabled from low to high in level, so the semiconductor device enters a write mode. Similarly, in this case, because the operation mode of the semiconductor device is not the test mode, the test mode signal TDISWTS is disabled low in level and the internal write enabling signal WTS is enabled high in level. As a result, in FIG. 6, the output signal from the inverter IV31 becomes high in level, and the logic unit 281 performs the AND operation with respect to the two high-level signals and thus outputs the MUX control signal YWTS which is high in level.

Then, in the MUX 270 of FIG. 5, the transfer gate TG21 is turned on and the transfer gate TG22 is turned off. The logic unit 271 performs the OR operation with respect to the first Y-address enabling signal YAE_1 and the second Y-address enabling signal YAE_2. At this time, because the enabled period of the first Y-address enabling signal YAE_1 is longer than that of the second Y-address enabling signal YAE_2, the first Y-address enabling signal YAE_1 is outputted from the transfer gate TG21 in the end. Then, the driver 290 drives the first Y-address enabling signal YAE_1 to the desired voltage level to output the final Y-address enabling signal YAE.

Therefore in the case where the semiconductor device is in the write mode, the final Y-address enabling signal YAE has an enabled period corresponding to the width of the internal clock DICLK, as shown in FIG. 7, so that the Y-address select signal has an enabled period longer than that in the read mode. In addition, because the internal clock DICLK, moreover, the internal clock ICLK and external clock CLK are little influenced by variations in external conditions, such as temperature, voltage, etc., or variations in process, little variation occurs in the enabled periods of the Y-address enabling signal YAE and Y-address select signal. In conclusion, according to the present embodiment, in the write mode, the enabled period of the Y-address select signal is subject to little variation and is longer than that in the read mode. Therefore, even when the semiconductor device performs the write operation at high speed, it can smoothly process data by securing an adequate data window, with little influence of variations in external conditions, such as temperature, voltage, etc., or variations in process.

On the other hand, at the time that the semiconductor device enters the test mode, the test mode signal TDISWTS is enabled high in level. Here, the test mode refers to a mode for analyzing the operation of the semiconductor device, namely, a mode for analyzing the operation of the semiconductor device based on variations in external conditions, such as temperature, voltage, etc., or variations in process. In FIG. 6, because the output signal from the inverter IV31 becomes low in level, the logic unit 281 outputs the MUX control signal YWTS of a low level irrespective of the level of the internal write enabling signal WTS.

Then, in the MUX 270 of FIG. 5, the transfer gate TG21 is turned off and the transfer gate TG22 is turned on, thereby causing the second Y-address enabling signal YAE_2 to be transferred through the transfer gate TG22. Consequently, the second Y-address enabling signal YAE_2 is outputted from the MUX 270. Then, the driver 290 drives the second Y-address enabling signal YAE_2 to the desired voltage level and thus outputs the final Y-address enabling signal YAE.

Hence, in the case where the semiconductor device is in the test mode, the final Y-address enabling signal YAE has the same enabled period as that of the second Y-address enabling signal YAE_2, as shown in FIG. 7, irrespective of whether the semiconductor device is in the read mode or write mode.

As described above, according to the present embodiment, in the write mode, the enabled period of the Y-address select signal is subject to little variation and is longer than that in the read mode. Therefore, even in the case where the semiconductor device performs the write operation at high speed, it can smoothly process data by securing an adequate data window, with little influence of variations in external conditions, such as temperature, voltage, etc., or variations in process.

Meanwhile, although the MUX control signal YWTS has been disclosed in the present embodiment to be generated by the MUX controller 280 to control the MUX 270, the internal write enabling signal WTS may be directly used instead of the MUX control signal YWTS to control the MUX 270, according to a different embodiment. That is, the internal write enabling signal WTS may be used to control the MUX 270 regardless of whether the semiconductor device is in the test mode. In this case, in the write mode, a signal having a longer enabled period, of the first Y-address enabling signal YAE_1 and second Y-address enabling signal YAE_2, can be used as the final Y-address enabling signal to secure an adequate data window irrespective of variations in external conditions.

Moreover, in this embodiment, in the case where the Y-address enabling signal is significantly reduced in enabled period, the clock period adjuster 230 can be used to increase the width, or period, of the internal clock DICLK, thus increasing the enabled periods of the Y-address enabling signal and Y-address select signal. Here, the clock period adjuster 230 may be implemented with a clock divider or any other type of traditional clock period adjustment device.

As apparent from the above description, a semiconductor device for generating a Y-address enabling signal, which determines the width of a Y-address select signal, may use a system clock in a write mode, so as to smoothly process data even in a high-speed write operation, with little influence of variations in external conditions, such as temperature, voltage, etc., or variations in process.

Although embodiments have been disclosed for illustrative purposes, those skilled in the art will appreciate that various modifications, additions and substitutions are possible, without departing from the scope and spirit of the invention as disclosed in the accompanying.

What is claimed is:

1. A semiconductor device comprising:
    a decoder for decoding a plurality of internal command signals and outputting a first Y-address enabling signal;
    a Y-address enabling signal generator for receiving the first Y-address enabling signal and outputting a second Y-address enabling signal having a predetermined enabled period;
    a multiplexer (MUX) for receiving the first Y-address enabling signal and the second Y-address enabling signal and selectively outputting any one thereof as a third Y-address enabling signal; and
    a MUX controller for controlling the MUX such that the MUX selects any one of the first Y-address enabling signal or second Y-address enabling signal according to an operation mode of the semiconductor device.

2. The semiconductor device as set forth in claim 1, wherein the MUX controller selects and outputs a signal having a longer enabled period, of the first Y-address enabling signal and second Y-address enabling signal, when the semiconductor device is in a write mode.

3. The semiconductor device as set forth in claim 2, wherein the MUX controller, when the semiconductor device is in a test mode, selects and outputs the second Y-address enabling signal irrespective of whether the semiconductor device is in the write mode.

4. The semiconductor device as set forth in claim 2, wherein the first Y-address enabling signal has an enabled period longer than that of the second Y-address enabling signal.

5. The semiconductor device as set forth in claim 3, wherein the first Y-address enabling signal has an enabled period longer than that of the second Y-address enabling signal.

6. The semiconductor device as set forth in claim 2, wherein the MUX controller includes a first logic unit for performing a logic operation with respect to an internal write enabling signal and a test mode signal to output a MUX control signal.

7. The semiconductor device as set forth in claim 6, wherein the first logic unit performs an AND operation.

8. The semiconductor device as set forth in claim 6, wherein the MUX includes:
    a second logic unit for performing a logic operation with respect to the first Y-address enabling signal and the second Y-address enabling signal;
    a first transfer gate for transferring an output signal from the second logic unit in response to the MUX control signal; and
    a second transfer gate for transferring the second Y-address enabling signal in response to the MUX control signal.

9. The semiconductor device as set forth in claim 8, wherein the second logic unit performs an OR operation.

10. The semiconductor device as set forth in claim 1, wherein the Y-address enabling signal generator includes:
    a delay for delaying the first Y-address enabling signal by a predetermined period;
    a buffer for buffering an output signal from the delay; and
    a logic unit for performing a logic operation with respect to the first Y-address enabling signal and an output signal from the buffer to output the second Y-address enabling signal.

11. The semiconductor device as set forth in claim 10, wherein the buffer is an inverter, the inverter performing an inverting/buffering operation.

12. The semiconductor device as set forth in claim 10, wherein the logic unit performs an AND operation.

13. The semiconductor device as set forth in claim 1, wherein the decoder performs an OR operation with respect to the internal command signals to output the first Y-address enabling signal.

14. The semiconductor device as set forth in claim 13, wherein the internal command signals are generated by decoding a plurality of buffered command signals synchronously with a clock-period-adjusted internal clock.

15. The semiconductor device as set forth in claim 1, further comprising a driver for driving the Y-address enabling signal from the MUX to a desired level.

16. A semiconductor device comprising:
    a decoder for decoding a plurality of internal command signals and outputting a first Y-address enabling signal;
    a Y-address enabling signal generator for receiving the first Y-address enabling signal and outputting a second Y-address enabling signal having a predetermined enabled period; and
    a multiplexer (MUX) for receiving the first Y-address enabling signal and the second Y-address enabling signal, selecting any one thereof based on an operation mode of the semiconductor device in response to a MUX control signal, and outputting the selected signal as a third Y-address enabling signal.

17. The semiconductor device as set forth in claim 16, wherein the MUX selects and outputs a signal having a longer enabled period, of the first Y-address enabling signal and second Y-address enabling signal, when the semiconductor device is in a write mode.

18. The semiconductor device as set forth in claim 17, wherein the first Y-address enabling signal has an enabled period longer than that of the second Y-address enabling signal.

19. The semiconductor device as set forth in claim 17, wherein the MUX control signal is an internal write enabling signal.

20. The semiconductor device as set forth in claim 17, wherein the MUX includes:
    a logic unit for performing a logic operation with respect to the first Y-address enabling signal and the second Y-address enabling signal;
    a first transfer gate for transferring an output signal from the logic unit in response to the MUX control signal; and
    a second transfer gate for transferring the second Y-address enabling signal in response to the MUX control signal.

21. The semiconductor device as set forth in claim 20, wherein the logic unit performs an OR operation.

22. The semiconductor device as set forth in claim 16, wherein the Y-address enabling signal generator includes:
    a delay for delaying the first Y-address enabling signal by a predetermined period;
    an inverter for inverting/buffering an output signal from the delay; and
    a logic unit for performing a logic operation with respect to the first Y-address enabling signal and an output signal from the inverter to output the second Y-address enabling signal.

23. The semiconductor device as set forth in claim 22, wherein the logic unit performs an AND operation.

24. The semiconductor device as set forth in claim 16, wherein the decoder performs an OR operation with respect to the internal command signals to output the first Y-address enabling signal.

25. The semiconductor device as set forth in claim 24, wherein the internal command signals are generated by decoding a plurality of buffered command signals synchronously with a clock-period-adjusted internal clock.

26. A semiconductor device comprising:
- a clock buffer for buffering a external clock to generate an internal clock;
- a clock period adjuster for adjusting a period of the internal clock;
- a command buffer for buffering a plurality of external command signals;
- a command decoder operated synchronously with an internal clock from the clock period adjuster, the command decoder decoding a plurality of command signals from the command buffer and generating a plurality of internal command signals;
- a decoder for decoding the internal command signals from the command decoder and outputting a first Y-address enabling signal;
- a Y-address enabling signal generator for receiving the first Y-address enabling signal and outputting a second Y-address enabling signal having a predetermined enabled period;
- a multiplexer (MUX) for receiving the first Y-address enabling signal and the second Y-address enabling signal and selectively outputting any one thereof as a third Y-address enabling signal; and
- a MUX controller for controlling the MUX such that the MUX selects any one of the first Y-address enabling signal or second Y-address enabling signal according to an operation mode of the semiconductor device.

27. The semiconductor device as set forth in claim 26, wherein the MUX controller selects and outputs a signal having a longer enabled period, of the first Y-address enabling signal and second Y-address enabling signal, when the semiconductor device is in a write mode.

28. The semiconductor device as set forth in claim 27, wherein the first Y-address enabling signal has an enabled period longer than that of the second Y-address enabling signal.

29. The semiconductor device as set forth in claim 27, wherein the MUX controller includes a first logic unit for performing a logic operation with respect to an internal write enabling signal and a test mode signal to output a MUX control signal.

30. The semiconductor device as set forth in claim 29, wherein the first logic unit performs an AND operation.

31. The semiconductor device as set forth in claim 29, wherein the MUX includes:
- a second logic unit for performing a logic operation with respect to the first Y-address enabling signal and the second Y-address enabling signal;
- a first transfer gate for transferring an output signal from the second logic unit in response to the MUX control signal; and
- a second transfer gate for transferring the second Y-address enabling signal in response to the MUX control signal.

32. The semiconductor device as set forth in claim 31, wherein the second logic unit performs an OR operation.

33. The semiconductor device as set forth in claim 26, wherein the Y-address enabling signal generator includes:
- a delay for delaying the first Y-address enabling signal by a predetermined period;
- an inverter for inverting/buffering an output signal from the delay; and
- a logic unit for performing a logic operation with respect to the first Y-address enabling signal and an output signal from the inverter to output the second Y-address enabling signal.

34. The semiconductor device as set forth in claim 33, wherein the logic unit performs an and operation.

* * * * *